US010825872B2

(12) United States Patent
Kim et al.

(10) Patent No.: US 10,825,872 B2
(45) Date of Patent: Nov. 3, 2020

(54) SELF-LIGHT EMITTING DISPLAY DEVICE FOR IMPROVING LIGHT EXTRACTION EFFICIENCY AND INCREASING LIFE SPAN

(71) Applicant: LG Display Co., Ltd., Seoul (KR)

(72) Inventors: Sooin Kim, Seoul (KR); Seungbum Lee, Gimpo-si (KR); Wonrae Kim, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/586,955

(22) Filed: Sep. 28, 2019

(65) Prior Publication Data
US 2020/0105838 A1 Apr. 2, 2020

(30) Foreign Application Priority Data
Sep. 28, 2018 (KR) .................. 10-2018-0115628

(51) Int. Cl.
*H01L 29/08* (2006.01)
*H01L 27/32* (2006.01)
(52) U.S. Cl.
CPC .................................. *H01L 27/322* (2013.01)
(58) Field of Classification Search
CPC ........... H01L 27/322; H01L 2251/5369; H01L 51/5271; H01L 51/5275; H01L 51/525
USPC ........................................................ 257/40
See application file for complete search history.

(56) References Cited

U.S. PATENT DOCUMENTS

| 10,018,871 B1* | 7/2018 | Song ..................... G02B 5/23 |
| 2003/0117474 A1* | 6/2003 | Harada ................ C09D 11/328 |
| | | 347/100 |
| 2016/0233273 A1* | 8/2016 | Ohyama ............... G02B 5/3083 |
| 2018/0151628 A1* | 5/2018 | Park .................... H01L 27/3206 |
| 2018/0156951 A1* | 6/2018 | Baek ................... G02F 1/133617 |
| 2018/0269362 A1* | 9/2018 | Lee ....................... H01L 33/502 |

(Continued)

FOREIGN PATENT DOCUMENTS

JP 6019992 B2 10/2016
KR 10-2017-0014755 A 2/2017

*Primary Examiner* — Caleb E Henry
(74) *Attorney, Agent, or Firm* — Polsinelli PC

(57) ABSTRACT

A self-light emitting display device comprises at least one pixel comprising a first region, a second region and a third region; a blue light emitting diode disposed in the at least one pixel and configured to emit blue light; partitions disposed over the blue light emitting diode and spaced apart from one another, the partitions defining the first region, the second region and the third region; a color conversion pattern disposed over the blue light emitting diode and including a red color converting unit disposed between the partitions in the first region and configured to convert the blue light into red light and a green color converting unit disposed between the partitions in the second region and configured to convert the blue light into green light; and a selective transmission layer configured to transmit the blue light and to reflect the green light and the red light and comprising a first selective transmission region corresponding to the first and second regions, wherein the first selective transmission region includes a first bottom portion disposed between the color conversion pattern and the blue light emitting diode, and a first wall portion disposed between the color conversion pattern and partitions and extending from the first bottom portion.

11 Claims, 2 Drawing Sheets

(56) References Cited

U.S. PATENT DOCUMENTS

| | | | |
|---|---|---|---|
| 2018/0275461 A1* | 9/2018 | Park | G02F 1/133512 |
| 2018/0292711 A1* | 10/2018 | Yoon | G02F 1/133617 |
| 2019/0137815 A1* | 5/2019 | Kim | H01L 51/5056 |
| 2019/0153319 A1* | 5/2019 | Kim | C09K 19/56 |
| 2019/0155106 A1* | 5/2019 | Lee | G02F 1/133621 |
| 2020/0106041 A1* | 4/2020 | Lee | H01L 51/5278 |
| 2020/0111842 A1* | 4/2020 | Kim | H01L 27/322 |

* cited by examiner

SELF-LIGHT EMITTING DISPLAY DEVICE FOR IMPROVING LIGHT EXTRACTION EFFICIENCY AND INCREASING LIFE SPAN

CROSS REFERENCE TO RELATED APPLICATION

The present disclosure claims priority to and the benefit of Korean Patent Application No. 10-2018-0115628 filed on Sep. 28, 2018, which is hereby incorporated by reference in its entirety.

BACKGROUND

Field of the Disclosure

The present disclosure relates to a self-light emitting display device.

Description of the Background

A display device may visually display data. As information society develops, there may be an increase in demands for various forms of display devices which display image. A liquid crystal display (LCD) and an organic light emitting diode (OLED) display device may be mainly used as such a display device.

The OLED may be a self-light emitting diode which converts electric energy into light energy using an organic material. In general, the OLED may have a structure in which an organic layer is disposed between an anode and a cathode. When driving voltage is applied between the anode and the cathode, holes may be injected through the anode, and electrons may be injected through the cathode. In this case, the holes and the electrons meet in the organic film and are coupled to each other. Accordingly, excitons are generated. When the state of the exciton is turned into a floor state, light is emitted.

The organic film has a structure in which layers consisting of different materials are stacked to enhance efficiency and safety of the organic light-emitting device. For instance, the organic film may include a hole injection layer, a hole transport layer, a light-emitting layer, an electron transport layer, an electron injection layer and the like.

SUMMARY

The present disclosure provides a self-light emitting display device capable of improving light extraction efficiency and increasing a lifespan.

The present disclosure also provides a self-light emitting display device capable of enhancing color conversion efficiency of the self-light emitting display device.

The problems to be solved by the present disclosure are not limited to those mentioned above, and the problems which are not mentioned can be clearly understood by those skilled in the art from the following description.

According to the present disclosure, a self-light emitting display device includes at least one pixel, a blue light emitting diode disposed in at least one pixel and emits blue light, partitions, a color conversion pattern, and a selective transmission layer.

The at least one pixel includes a first region, a second region, and a third region. The partitions are disposed above the blue light emitting diode and are spaced apart from one another. The first region, the second region, and the third region are partitioned by the partitions.

The color conversion pattern is disposed above the blue light emitting diode, and includes a red color converting unit and a green color converting unit. The red color converting unit is disposed between the partitions in the first region to convert the blue light into red light, and the green color converting unit is disposed between the partitions in the second region to convert the blue light into green light.

The selective transmission layer reflects the green light and the red light, and includes a first selective transmission region. The first selective transmission region includes a bottom portion and a wall portion. The bottom portion is disposed between the color conversion pattern and the blue light emitting diode, and the wall portion is disposed between the color conversion pattern and the partitions, and is connected to the bottom.

The self-light emitting display device may further include a color filter pattern which only absorbs the blue light selectively. The color filter pattern may include a first color filter unit and a second color filter unit. The first color filter unit may be disposed on the red color converting unit in the first region, and the second color filter unit may be disposed on the green color converting unit in the second region.

Details of other implementations are included in the detailed description and drawings.

According to the present disclosure, the self-light emitting display device includes a selective transmission layer which transmits blue light and reflects red light and green light, so that amount of recycled light of the self-light emitting display device is increased, thereby enhancing light extraction efficiency of the self-light emitting display device and increasing a lifespan of the self-light emitting display device.

In addition, as high-temperature plasticity is not required to form the color conversion pattern, deterioration in the efficiency of the material of the color conversion pattern due to the high-temperature plasticity may be minimized, thereby improving the color conversion efficiency.

According to the present disclosure, the effects of the self-light emitting display device are not limited to the contents exemplified above, and more various effects are included in the present disclosure.

BRIEF DESCRIPTION OF THE DRAWINGS

The accompanying drawings, which are included to provide a further understanding of the disclosure and are incorporated in and constitute a part of the present disclosure, illustrate aspects of the disclosure and together with the description serve to explain the principles of the disclosure.

In the drawings.

DETAILED DESCRIPTION

The advantages, features, and methods for accomplishing them of the present disclosure will become apparent with reference to accompanying drawings as well as implementations and experimental examples described below in detail. It is noted that the accompanying drawings make those skilled in the art easily understand the idea of the technology disclosed in the present disclosure and it is not construed that the idea of the technology thereof is limited to the accompanying drawings.

Further, the present disclosure is not limited to the matter described below, but may be implemented in various manners, and the matters described below are provided so that the description of the disclosure will be complete and thorough and to fully convey the scope of the present disclosure to those skilled in the art to which the present disclosure pertains and the present disclosure is only defined by the scope of claims.

When it is determined that the detailed description of the known technology related to the present disclosure may obscure the gist of the present disclosure, the detailed description thereof will be omitted.

"A first", "a second", and the like are used to describe various components, however, these components are not limited to these terms. These terms are used to distinguish one component from another component and a first component may be a second component unless otherwise stated.

Unless otherwise stated, each component may be singular or plural throughout the disclosure.

In the present disclosure, unless otherwise stated, when any portion is referred to as "including" or "having" another component, it means not excluding other components but further including other component.

In the present disclosure, unless otherwise stated, "A and/or B" means A, B or A and B. Unless otherwise stated, "C to D" means "C or more and D or less".

Elements or layers being provided "on" or "on" another element or layer includes elements or layers being provided on another element or layer and elements or layers with which another layer or another element is interposed. On the other hand, elements being referred to as provided "directly on" or "directly on" denote elements with which another element or layer is not interposed.

As shown in the figures, spatially relative terms, such as "below", "beneath", "lower", "above", "upper", and the like, may be used to easily describe relations between one element or components and another element or component. The spatially relative terms should be understood as a term to encompass different orientations of the device in use and operation in addition to the orientation depicted in the figures.

Hereinafter, the present disclosure will be described in more detail with reference to the drawings.

Figure 1:
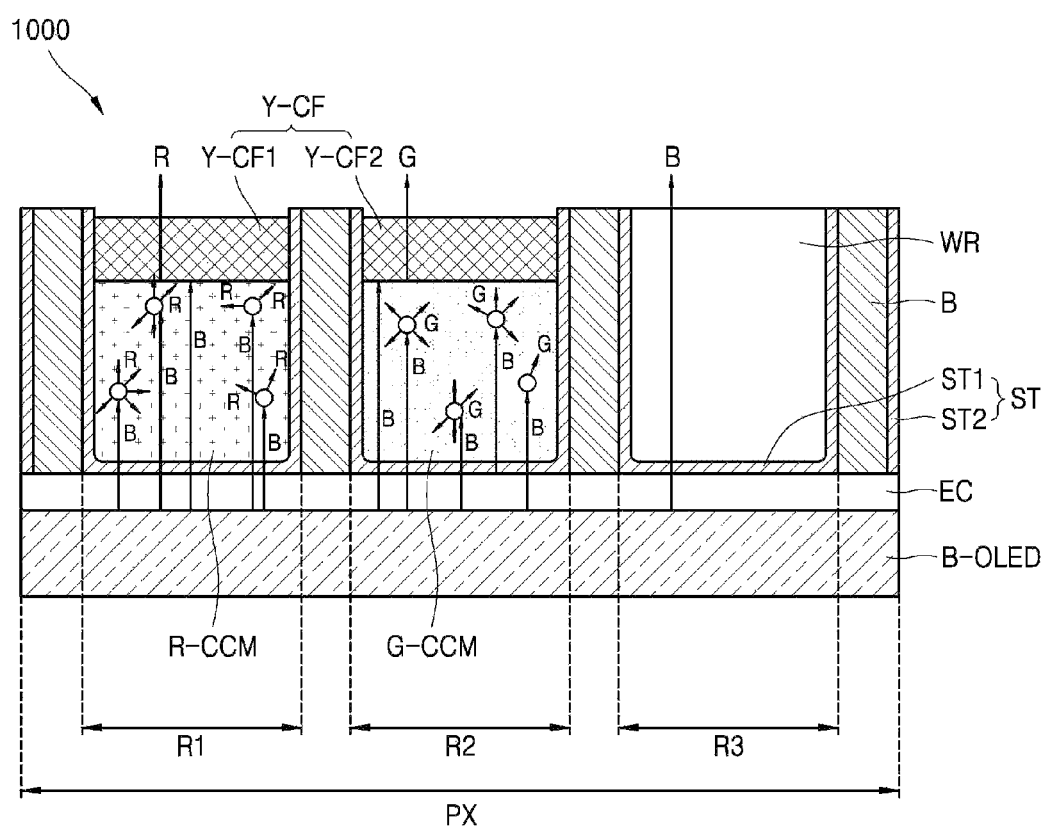
FIG. 1 is a schematic view of a portion of a self-light emitting display device according to an aspect of the present disclosure.

FIG. 1 is a schematic view of a self-light emitting display device 1000 according to an implementation of the present disclosure.

The self-light emitting display device 1000 includes at least one pixel PX, a blue light emitting diode B-OLED which emits blue light B, an encapsulation layer EC, partitions B, color conversion patterns R-CCM and G-CCM, and a selective transmission layer ST.

The at least one pixel PX includes a first region R1, a second region R2, and a third region R3. The first region R1, the second region R2, and the third region R3 may be a red pixel region, a green pixel region, and a blue pixel region, respectively.

The blue light emitting diode B-OLED is disposed in at least one pixel PX and emits blue light B in all directions. A portion of the blue light B emitted above the blue light emitting diode B-OLED is emitted to the first region R1 and the second region R2 and is converted into light in a long wavelength band, by the color conversion patterns R-CCM and G-CCM compared to the blue light B so as to be emitted from the self-light emitting display device 1000. Another portion of the blue light B emitted above the blue light emitting diode B-OLED is emitted to the third region R3 and does not pass through the color conversion patterns R-CCM and G-CCM, and may be emitted from the self-light emitting display device 1000 in a state of blue light B.

The blue light emitting diode B-OLED may include an organic layer (not shown) interposed between an anode (not shown) and a cathode (not shown), and the organic layer (not shown) may include a hole transport layer (not shown), a blue light emitting layer (not shown), and an electron transport layer (not shown). The organic layer (not shown) may further include a hole injection layer (not shown) and/or an electron injection layer (not shown) selectively.

The encapsulation layer EC may be disposed on the blue light emitting diode B-OLED to prevent moisture or air, and the like, from penetrating into the blue light emitting diode B-OLED from the outside, and to protect the blue light emitting diode B-OLED from an external shock. The encapsulation layer EC may include a first part disposed between the blue light emitting diode B-OLED and the partitions B and a second part disposed between the blue light emitting diode B-OLED and a bottom portion ST1 of a selective transmission layer ST. The encapsulation layer EC may be formed of a single layer and the first part and the second part may be connected to each other.

The partitions B are spaced apart from one another on the encapsulation layer EC and a first region R1, a second region R2 and a third region R3 of at least one pixel PX may be defined by the partitions B. Specifically, the partitions B may be divided into a first partition, a second partition, and a third partition. The first region R1 may be defined as a region between the first partitions, and the second region R2 may be defined as a region between the first partition and the second partition, and the third region R3 may be defined as a region between the second partition and the second partition. The partitions B may be made of, for example, a black photoresist including black pigment and a photosensitive resin.

The selective transmission layer ST may transmit the blue light B emitted from the blue light emitting diode B-OLED and reflect the red light R and the green light G. The selective transmission layer ST may have a structure in which a layer of low refractive index inorganic material and a layer of high refractive index inorganic material are alternately laminated. The structure in which the layer of the low refractive index inorganic material and the layer of high refractive index inorganic material are laminated alternately may cause optical interference that selectively reflects or transmits light of a specific wavelength due to interlayer interference. The selective transmission layer ST may selectively reflect the red light R and the green light G by controlling a difference in refractive index between the layer of the low refractive index inorganic material and the layer of high refractive index inorganic material and a difference in thickness between the layer of the low refractive index inorganic material and the layer of high refractive index inorganic material.

The selective transmission layer ST includes a bottom portion ST1 and a wall portion ST2 connected to the bottom portion ST1. The bottom portion ST1 may be disposed on the encapsulation layer EC and may be disposed between the encapsulation layer EC and the color conversion patterns R-CCM and G-CCM. The wall portion ST2 may be disposed at a side of the partitions B and may be disposed between the color conversion patterns R-CCM and G-CCM and the partitions B.

The selective transmission layer ST may be divided into a first selective transmission region and a second selective transmission region. The first selective transmission region corresponds to the first and second regions and the second selective transmission region corresponds to the third region.

The color conversion patterns R-CCM and G-CCM may be disposed between the partitions B above the encapsulation layer EC and, specifically, may be disposed in the first selective transmission region. The color conversion patterns R-CCM and G-CCM include a red color converting unit R-CCM and a green color converting unit G-CCM, and the red color converting unit R-CCM is disposed on the bottom portion ST1 and the wall portion ST2 in the first selective transmission region, at the first region R1, and the green color converting unit G-CCM is disposed between the bottom portion ST1 and the wall portion ST2 in the first selective transmission region, at the second region R2.

The red color converting unit R-CCM may be disposed between the partitions B in the first region R1 and may convert the blue light B which is emitted from the blue light emitting diode B-OLED and is incident on the red color converting unit R-CCM through the encapsulation layer EC and the bottom portion ST1 in the first selective transmission region into the red light R.

The green color converting unit G-CCM may be disposed between the partitions B in the second region R2 and may convert the blue light B which is emitted from the blue light emitting diode B-OLED and is incident on the green color converting unit G-CCM through the encapsulation layer EC and the bottom portion ST1 in the first selective transmission region into the green light G.

The red light R emitted from the red color converting unit R-CCM toward the bottom portion ST1 and the wall portion ST2 of the first selective transmission region is reflected by the bottom portion ST1 and the wall portion ST2, and is recycled. The red light G emitted from the green color converting unit G-CCM toward the bottom portion ST1 and the wall portion ST2 of the first selective transmission region is reflected by the bottom portion ST1 and the wall portion ST2 and is recycled. Light extraction efficiency of the self-light emitting display device 1000 may be improved by the selective transmission layer ST.

The color conversion patterns R-CCM and G-CCM include color conversion material, and examples of the color conversion material may include a Quantum Dot, a fluorescent dye or a combination thereof. Examples of the fluorescent dyes include organic fluorescent materials, inorganic fluorescent materials, and a combination thereof.

The quantum dots may adjust an emission wavelength by only adjusting a size of a particle of the quantum dots based on a quantum confinement effect. The quantum dot may be selected from, but is not limited to, a Group II-VI compound, a Group III-V compound, a Group IV-VI compound, a Group IV element, a Group IV compound, and a combination thereof. The Group II-VI compounds may be selected from the group consisting of a binary compound selected from the group consisting of CdSe, CdTe, ZnS, ZnSe, ZnTe, ZnO, HgS, HgSe, HgTe, MgSe, MgS and a mixture thereof; a trivalent compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe and a mixture thereof. The Group III-V compound may be selected from the group consisting of a binary compound selected from the group consisting of GaN, GaP, GaAs, GaSb, AlN, AlP, AlAs, AlSb, InN, InP, InAs, InSb and a mixture thereof; a trivalent compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP and a mixture thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and a mixture thereof. The Group IV-VI compound may be selected from the group consisting of a binary compound selected from the group consisting of SnS, SnSe, SnTe, PbS, PbSe, PbTe, and a mixture thereof; a trivalent compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof. The Group IV elements may be selected from the group consisting of Si, Ge, and a mixture thereof. The Group IV compound may be the binary compound selected from the group consisting of SiC, SiGe, and a mixture thereof.

At this time, the binary compound, the trivalent compound, or the quaternary compound may be present in a particle at a uniform concentration, or may be present in the same particle with different concentration distributions from one another. The binary compound, the trivalent compound, or the quaternary compound may have a core/shell structure in which one quantum dot surrounds another quantum dot. At an interface between the core and the shell, a concentration gradient in which the concentration of the element present in the shell is lowered toward a center of the quantum dots may be provided.

The quantum dot may have a full width of half maximum (FWHM) of an emission spectrum of about 45 nm or less, preferably about 40 nm or less, more preferably about 30 nm or less, thereby improving color purity or color reproducibility in this range. Further, the light generated by the quantum dots is emitted in all directions, so that a viewing angle range may be enhanced.

Further, a shape of the quantum dots is not particularly limited to a generally used form and, more specifically, the shape of the quantum dots may be a nanoparticle which has a spherical shape, a pyramidal shape, a multi-arm shape or a cubic shape, a nanotube, nanowires, nanofibers, nano-sized particles having a plate shape, and the like.

Examples of fluorescent dye may include a red fluorescent dye, a green fluorescent dye, a dye which emits light of a third color other than the red and the green or a combination thereof. The red fluorescent dye may be a material which absorbs the light in the green wavelength band and emits the light in the red wavelength band and, may be, for example, at least one of (Ca, Sr, Ba)S, (Ca, Sr, Ba)2Si5N8, CaAlSiN3, CaMoO4, Eu2Si5N8. The green fluorescent dye may be a material which absorb the light in a blue wavelength band to emit a light in the green wavelength band and may be at least one of, for example, yttrium aluminum garnet, YAG), (Ca, Sr, Ba)2SiO4, SrGa2S4, barium magnesium aluminate (BMA), alpha-SIALON (α-SiAlON), beta-SIALON (β-SiAlON), Ca3Sc2Si3O12, Tb3Al5O12, BaSiO4, CaAlSiON, (Sr1-xBax)Si2O2N2.

The color conversion patterns R-CCM and G-CCM may be formed by filling ink composition including a color conversion material in a space surrounded by the bottom portion ST1 and the wall portion ST2 of the first selective transmission region. That is, the color conversion patterns R-CCM and G-CCM may be formed using ink-jet printing. When the color conversion patterns R-CCM and G-CCM are formed by inkjet printing, a process of high-temperature plasticity at about 230□ may be omitted so that a number of processes may be reduced compared to the case in which the color conversion patterns R-CCM and G-CCM are formed through photocuring, thereby enhancing efficiency of a process of forming the color conversion pattern.

Meanwhile, the self-light emitting display device 1000 has a structure of color filter unit on encapsulation (CoE). A manufacturing process of the structure of CoE includes forming an encapsulation layer EC on the blue light emitting diode B-OLED, forming partitions B on the encapsulation layer EC, depositing a selective transmission layer ST on the encapsulation layer EC and the partitions B, and forming the color conversion patterns R-CCM and G-CCM by inkjet printing, in which the above-mentioned processes are performed sequentially and continuously.

In the related art, in a general self-light emitting display device, an upper substrate including the color filter pattern and a lower substrate including the encapsulated light emitting diode are prepared in separate processes from each other, and subsequently the upper substrate and the lower substrate are attached together using a filling agent.

The structure of the CoE enables eliminating the need for attachment between the upper substrate and the lower substrate, thereby reducing misalignment error between the upper substrate and the lower substrate. Further, as no filling agent is required, it is possible to prevent an increase in thickness of the display device due to the filling agent and it is not required to attach the color filter substrate to the lower substrate, thereby preventing an increase in thickness of the display device due to the filling agent.

The self-light emitting display device 1000 may further include a color filter pattern Y-CF which selectively absorbs the blue light B. The color filter pattern Y-CF may include a first color filter unit Y-CF1 and a second color filter unit Y-CF2. The first color filter unit Y-CF1 may be disposed in the first region R1 and may be disposed on the red color converting unit R-CCM between the wall portions ST2 of the first selective transmission region. The second color filter unit Y-CF2 may be disposed in the second region R2 and may be disposed on the green color converting unit G-CCM between the wall portions ST2 of the first selective transmission region.

The first color filter unit Y-CF1 and the second color filter unit Y-CF2 may include a yellow dye having weak light resistance and a thermosetting resin. Examples of the yellow dye having weak light resistance may include azo-based yellow dye. The azo-based yellow dye has a feature of color shift depending on changes in a chemical structure when the azo-based yellow dye is exposed to a fluorescent light source and has a weak light resistance compared to other dyes which has different structures from the azo-based yellow dye.

Examples of the azo-based yellow dyes may include C.I reactive yellow, and examples of C.I reactive yellow may include, but is not limited to, C.I Reactive Yellow 1, 2, 3, 4, 5, 13, 14, 15, 16, 17, 18, 22, 23, 25, 35, 36:1, 37, 39, 42, 44, 45:1, 55, 57, 66, 72, 76, 78, 81, 84, 85, 86, 95, 105, 107, 121, 133, 135, 138, 143, 145, 148, 151, 154, 156, 157, 158, 160, 161, 162, 164, 167, 174, 176, 178, 179, 184, 185, 186, 193, 201, 202, 205, 206, 207, 208, 209, 210, 211, 212 and 213.

The first color filter unit Y-CF1 absorbs blue light B which is not converted, by the red color converting unit R-CCM, into the red light R among the light incident on the color filter unit via the red color converting unit R-CCM, thereby enhancing color purity of the self-light emitting display device 1000. The second color filter unit Y-CF2 absorbs the blue light B which is not converted, by the green color converting unit G-CCM, into the green light G among the light incident on the color filter unit via the green color converting unit G-CCM, thereby improving the color purity of the self-light emitting display device 1000.

In addition, the color filter pattern Y-CF may absorb external light to improve a degree in which the reflected light is visually sensed of the self-light emitting display device 1000.

The third region R3 does not include the color conversion patterns R-CCM and G-CCM, and a white resin layer WR may be disposed in the second selective transmission region of the selective transmission layer ST. The second selective transmission region includes a bottom portion ST1 disposed between the white resin layer WR and the blue light emitting diode B-OLED and a wall portion ST2 which extends from the bottom portion ST1 and is disposed between the white resin layer WR and the partitions B.

The white resin layer WR may transmit the blue light B which is emitted from the blue light emitting diode B-OLED and is incident on the white resin layer WR through the encapsulation layer EC and the bottom portion ST1 in the second selective transmission region. The white resin layer WR may be disposed between the partitions B at the upper portion of the encapsulation layer EC, and specifically, may be disposed on the bottom portion ST1 and the wall portion ST2 in the second selective transmission region in the third region R3.

Figure 2:
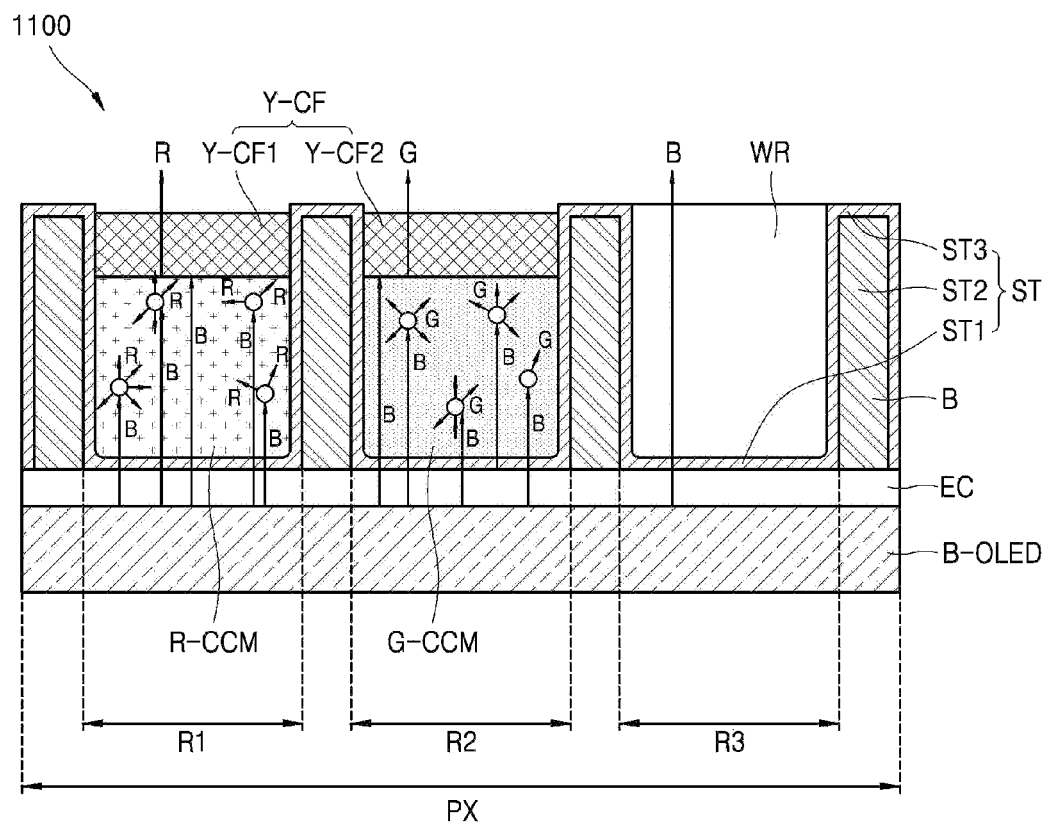
FIG. 2 is a schematic view of a self-light emitting display device according to another aspect of the present disclosure.

FIG. 2 is a schematic view of a self-light emitting display device 1100 according to another implementation of the present disclosure. Hereinafter, repetitive description of the contents described with reference to FIG. 1 will be omitted. The self-light emitting display device 1100 is different from the self-light emitting display device 1000 in that the selective transmission layer ST further includes a ceiling ST3 which covers an upper surface of the partitions B. The ceiling ST3 may be connected to the wall portion ST2 to provide a selective transmission layer ST in a form of a single layer.

In the self-light emitting display device 1000, as external light is absorbed at the upper surface of the partitions B made of black photoresist, the external light reflectance may be lowered compared to the self-light emitting display device 1100. In the self-light emitting display device 1100, the upper surface of the partitions B made of black photoresist is covered by the ceiling ST3, thereby external reflectance of the self-light emitting display device 1100 may increase compared to the self-light emitting display device 1000 in which the ceiling ST3 is not present.

While the present disclosure has been described with reference to the accompanying drawings, it is to be understood that the present disclosure is not limited to the above implementations, and the disclosure may be made in various manners in combination of matters disclosed in each implementation and those skilled in the art to which the disclosure pertains can understand that the disclosure may be implemented in other specific manners without changing the technical idea or necessary feature of the disclosure. Thus, it is to be understood that the above-described implementations are to be considered in all respects as illustrative and not restrictive.

What is claimed is:

1. A self-light emitting display device, comprising:
   at least one pixel, each pixel comprising a first region, a second region and a third region;
   a blue light emitting diode disposed in the at least one pixel and configured to emit blue light;

partitions disposed over the blue light emitting diode and spaced apart from one another, the partitions corresponding to boundary of each of the first region, the second region and the third region to define the first region, the second region and the third region;

a color conversion pattern disposed over the blue light emitting diode and between the partitions, wherein the color conversion pattern includes a red color converting unit corresponding to the first region and configured to convert the blue light into red light and a green color converting unit corresponding to the second region and configured to convert the blue light into green light;

a color filter pattern disposed over the color conversion pattern and between the partitions; and a selective transmission layer configured to transmit the blue light and to reflect the green light and the red light, wherein the selective transmission layer includes a bottom portion facing to the blue light emitting diode and a wall portion facing to an inside surface of each of the partitions and vertically extending from the bottom portion, and wherein, in the first and second regions, the wall portion of the selective transmission layer is disposed between the inside surface of each of the partitions and the color conversion pattern but also between the inside surface of each of the partitions and the color filter pattern.

2. The self-light emitting display device of claim 1, wherein the color filter pattern is configured to only absorb the blue light and includes a first color filter unit disposed over the red color converting unit in the first region and a second color filter unit disposed on the green color converting unit in the second region.

3. The self-light emitting display device of claim 1, further comprising a white resin layer disposed over the blue light emitting diode, disposed between the partitions in the third region, and configured to transmit the blue light, wherein the third region includes the white resin layer instead of the color conversion pattern and the color filter pattern.

4. The self-light emitting display device of claim 3, wherein, in the third region, the bottom portion of the selective transmission layer is disposed between the white resin layer and the blue light emitting diode, and the wall portion of the selective transmission layer is disposed between the inside surface of each of the partitions and the white resin layer.

5. The self-light emitting display device of claim 1, further comprising an encapsulation layer configured to cover the blue light emitting diode, wherein the partitions and the bottom portion of the selective transmission layer are disposed on the encapsulation layer.

6. The self-light emitting display device of claim 1, the selective transmission layer further includes a top portion disposed on a top surface of the partitions.

7. A self-light emitting display device, comprising:

a pixel comprising first, second and third regions adjacent to one another;

a blue light emitting diode disposed in the pixel and configured to emit blue light;

partitions disposed over the blue light emitting diode and corresponding to boundary of each of the first region, the second region and the third region to define the first, second and third regions;

first and second color conversion units respectively disposed in the first and second regions and configured to respectively convert the blue light to red light and green light;

a third color conversion unit disposed in the third region and allowing the blue light to transmit, and a selective transmission layer configured to transmit the blue light and to reflect the green light and the red light, wherein the first color conversion unit includes a first color conversion pattern disposed on the bottom portion of the selective transmission layer and a first filter pattern disposed on the first color conversion pattern, and the second color conversion unit includes a second color conversion pattern disposed on the bottom portion of the selective transmission layer and a second filter pattern disposed on the second color conversion pattern, wherein the selective transmission layer includes a bottom portion facing to the blue light emitting diode and a wall portion facing to an inside surface of each of the partitions and vertically extending from the bottom portion, and wherein the wall portion of the selective transmission layer is disposed between the inside surface of each of the partitions and each of the first, second and third color conversion units.

8. The self-light emitting display device of claim 7, wherein the selective transmission layer further includes a top portion disposed on a top surface of the partitions.

9. The self-light emitting display device of claim 7, wherein the third color conversion unit includes a white resin layer.

10. The self-light emitting display device of claim 7, further comprising an encapsulation layer configured to cover the blue light emitting diode, wherein the partitions and the bottom portion of the selective transmission layer are disposed on the encapsulation layer, and wherein the first, second and third color conversion unit are disposed on the bottom portion of the selective transmission layer.

11. The self-light emitting display device of claim 7, wherein the first color filter pattern and the second color filter pattern include a yellow dye and a thermosetting resin.

\* \* \* \* \*